United States Patent
Sung (10) Patent No.: US 11,186,918 B2
(45) Date of Patent: Nov. 30, 2021

(54) MICRO-ROUGHENED ELECTRODEPOSITED COPPER FOIL AND COPPER CLAD LAMINATE USING THE SAME

(71) Applicant: CO-TECH DEVELOPMENT CORP., Taipei (TW)

(72) Inventor: Yun-Hsing Sung, Taoyuan (TW)

(73) Assignee: CO-TECH DEVELOPMENT CORP., Taipei (TW)

( * ) Notice: Subject to any disclaimer, the term of this patent is extended or adjusted under 35 U.S.C. 154(b) by 37 days.

(21) Appl. No.: 16/672,860

(22) Filed: Nov. 4, 2019

(65) Prior Publication Data

US 2020/0141017 A1    May 7, 2020

(30) Foreign Application Priority Data

Nov. 5, 2018   (TW) .................. 107139174

(51) Int. Cl.

| | |
|---|---|
| C25D 7/04 | (2006.01) |
| C25D 1/04 | (2006.01) |
| H05K 3/02 | (2006.01) |
| B32B 15/08 | (2006.01) |
| C25D 3/38 | (2006.01) |
| B32B 15/20 | (2006.01) |
| H05K 3/38 | (2006.01) |

(52) U.S. Cl.
CPC ............... *C25D 1/04* (2013.01); *B32B 15/08* (2013.01); *B32B 15/20* (2013.01); *C25D 3/38* (2013.01); *H05K 3/022* (2013.01); *H05K 3/382* (2013.01); *Y10T 428/12431* (2015.01)

(58) Field of Classification Search
None
See application file for complete search history.

(56) References Cited

U.S. PATENT DOCUMENTS

2016/0165714 A1*  6/2016  Chen .................... H05K 3/4602
                                                            174/250
2018/0288884 A1* 10/2018  Ori ........................ H05K 3/384

FOREIGN PATENT DOCUMENTS

| CN | 206721376 U | 12/2017 |
|---|---|---|
| CN | 107614760 A | 1/2018 |
| JP | 6237078 A | 8/1994 |
| JP | 2004263300 A | 9/2004 |
| JP | 2005240132 A | 9/2005 |
| JP | 2008285751 A | 11/2008 |
| JP | 2018172785 A | 11/2018 |

(Continued)

*Primary Examiner* — Seth Dumbris
(74) *Attorney, Agent, or Firm* — Li & Cai Intellectual Property (USA) Office (57) ABSTRACT

The present disclosure provides a micro-rough electrolytic copper foil and a copper clad laminate. The electrolytic copper foil has a micro-rough surface formed with mountain-shaped structures and recessed structures. A multiplication value of an arithmetic mean height (Sa) and a vertex density (Spd) of the mountain-shaped structures measured according to ISO 25178 is between 150000 μm/mm² and 400000 μm/mm². An arithmetic mean undulation (Wa) of the mountain-shaped structures measured according to JIS B0601:2001 is between 0.06 μm and 1.5 μm. Therefore, the electrolytic copper foil with good binding strength and electrical properties can be obtained.

13 Claims, 9 Drawing Sheets

(56) References Cited

FOREIGN PATENT DOCUMENTS

| WO | WO 2015033917 A1 | 3/2015 | |
|---|---|---|---|
| WO | 2017006739 A1 | 1/2017 | |
| WO | WO-2017006739 A1 * | 1/2017 | ............. B32B 15/08 |

* cited by examiner

MICRO-ROUGHENED ELECTRODEPOSITED COPPER FOIL AND COPPER CLAD LAMINATE USING THE SAME

CROSS-REFERENCE TO RELATED PATENT APPLICATION

This application claims the benefit of priority to Taiwan Patent Application No. 107139174, filed on Nov. 5, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrodeposited copper foil and its applications, and more particularly to a micro-roughened electrodeposited copper foil and a copper clad laminate using the same.

BACKGROUND OF THE DISCLOSURE

With the development of information and electronic industries, high-frequency and high-speed signal transmission has become an integral part of modern circuit design and manufacture. In order to meet the high-frequency and high-speed signal transmission requirements of electronic products, the copper foil substrate used needs to have a good insertion loss performance at high frequencies so as to transmit high-frequency signals without excessive loss. The insertion loss of the copper foil substrate is highly correlated with its surface roughness. The copper foil substrate has a good insertion loss performance when the surface roughness is decreased, or otherwise does not. However, the decrease of the surface roughness may reduce the peel strength between the copper foil and the substrate. Therefore, how the peel strength can be maintained at the industry level and provide good insertion loss performance has become a problem to be solved in the related field.

SUMMARY OF THE DISCLOSURE

In response to the above-referenced technical inadequacies, the present disclosure provides a micro-roughened electrodeposited copper foil and a copper clad laminate using the micro-roughened electrodeposited copper foil.

In one aspect, the present disclosure provides a micro-roughened electrodeposited copper foil which has a micro-rough surface. The micro-rough surface has a plurality of mountain-shaped structures and a plurality of recessed structures relative to the mountain-shaped structures. A multiplication value of an arithmetic mean height (Sa) and a vertex density (Spd) of the mountain-shaped structures measured in compliance with the ISO 25178 standard is from 150,000 $\mu m/mm^2$ to 400,000 $\mu m/mm^2$. An arithmetic mean undulation (Wa) of the mountain-shaped structures measured in compliance with the JIS B0601-2001 standard is from 0.06 $\mu m$ to 1.5 $\mu m$.

A shape measurement laser microscope ("VK-X100" made by Keyence Corporation) is used for the measurements, in which the measured area of the micro-rough surface of the micro-roughened electrodeposited copper foil is 22500 $\mu m^2$ (e.g., 150 $\mu m \times 150$ $\mu m$) and the magnification is 1,000×. The setting parameters of Wa, Sa and Spd values are listed as follows.

Arithmetic Mean Undulation (Wa):
Filtering parameters: smooth size: 5×5; filter type: median;
Measuring area: 150 $\mu m$ width; 150 $\mu m$ height;
Standard: JIS B0601-2001 (ISO 4278:1997);
Cut-off values: $\lambda s$: 0.25 $\mu m$; $\lambda c$: 0.08 mm; and $\lambda f$: 80 mm.
Arithmetic Mean Height (Sa) and Vertex Density (Spd):
Measuring area: 150 $\mu m$ width; 150 $\mu m$ height;
Cut-off value according to the S-filter: 0.8 $\mu m$; and
Cut-off value according to the L-filter: 0.1 mm.

In one aspect, the present disclosure provides a copper clad laminate which includes a substrate and a micro-roughened electrodeposited copper foil. The micro-roughened electrodeposited copper foil is attached to a surface of the substrate and having a micro-rough surface that contacts the surface. The micro-rough surface has a plurality of mountain-shaped structures and a plurality of recessed structures relative to the mountain-shaped structures. A multiplication value of an arithmetic mean height (Sa) and a vertex density (Spd) of the mountain-shaped structures measured in compliance with the ISO 25178 standard is from 150,000 $\mu m/mm^2$ to 400,000 $\mu m/mm^2$. An arithmetic mean undulation (Wa) of the mountain-shaped structures measured in compliance with JIS B0601-2001 standard is from 0.06 $\mu m$ to 1.5 $\mu m$.

In certain embodiments, the multiplication value (Sa× Spd) of the arithmetic mean height and the vertex density of the mountain-shaped structures is greater than 240,000 $\mu m/mm^2$ and less than or equal to 350,000 $\mu m/mm^2$.

In certain embodiments, the arithmetic mean undulation (Wa) of the mountain-shaped structures is greater than 0.1 $\mu m$ and less than or equal to 1.5 $\mu m$.

In certain embodiments, each of the recessed structures has a U-shaped or V-shaped cross-section profile.

In certain embodiments, the micro-rough surface has a surface roughness Rz less than or equal to 2.3 $\mu m$ measured in compliance with the JIS 94 standard.

One of the advantages of the present disclosure is that the micro-rough surface of the micro-roughened electrodeposited copper foil has a multiplication value of an arithmetic mean height (Sa) and a vertex density (Spd) and an arithmetic mean undulation (Wa), which fall with respective predetermined ranges, such that the signal transmission loss can be significantly reduced without reducing the bonding strength relative to a substrate. That is to say, it can provide a balance of good bonding strength and good insertion loss performance.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Electronic products are gradually developed toward small size, high speed, multifunction and high reliability. Therefore, the present disclosure provides a micro-roughened electrodeposited copper foil that is helpful to form a fine circuit pattern having a fine line width and line spacing while ensuring a good bonding strength relative to a substrate. More importantly, said fine circuit pattern can significantly reduce the signal transmission loss.

As used herein, the term "arithmetic mean height (Sa)" represents the average value of the absolute value of the difference in height between each point on a mean surface with respect to a roughened surface, which is measured in compliance with the ISO 25178 standard, and is the expansion of Ra (i.e., arithmetical mean height of a line) of the roughened surface. The term "vertex density (Spd)" represents the number of the mountain-shaped structure per unit surface area, which is measured in compliance with the ISO 25178 standard; a higher Spd value indicates a greater amount of the contact points between the roughened surface and other objects. The Sa and Spd values can be obtained by measuring the surface profile of the predetermined area of the roughened surface by a laser microscope. The term "arithmetic mean undulation (Wa)" represents the slope of the surface profile of the roughened surface, which is measured in compliance with JIS B0601-2001 standard.

Figure 1:
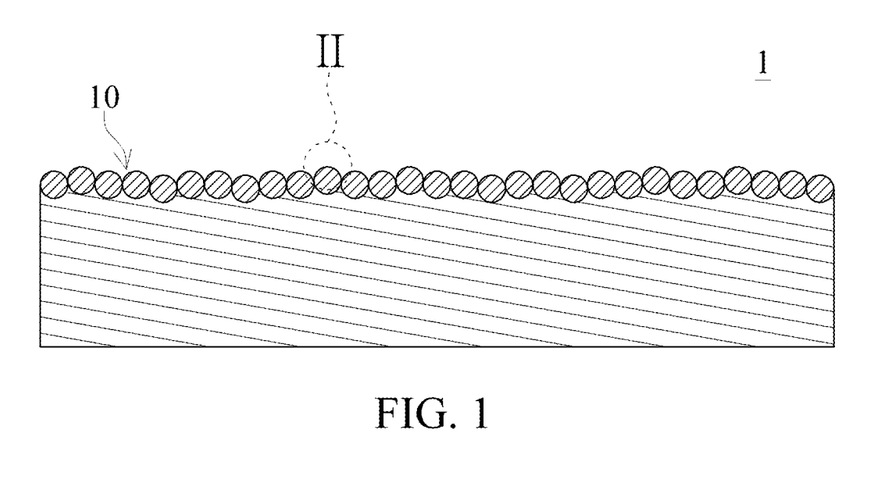
FIG. 1 is a schematic view of a micro-roughened electrodeposited copper foil of the present disclosure.

Referring to FIG. 1, the micro-roughened electrodeposited copper foil 1 has at least one micro-rough surface 10. The micro-rough surface 10 has a plurality of mountain-shaped structures 11 and a plurality of recessed structures 12 relative to the mountain-shaped structures 11. It should be noted that, a multiplication value (Sa×Spd) of an arithmetic mean height (Sa) and a vertex density (Spd) of the mountain-shaped structures 11 measured in compliance with the ISO 25178 standard is from 150,000 μm/mm² to 400,000 μm/mm², preferably from 240,000 μm/mm² to 350,000 μm/mm². An arithmetic mean undulation (Wa) of the mountain-shaped structures 11 measured in compliance with JIS B0601-2001 standard is greater than 0.06 μm and less than or equal to 1.5 μm, preferably greater than 0.1 μm and less than or equal to 1.5 μm.

Therefore, the micro-roughened electrodeposited copper foil 1 of the present disclosure can have good electrical properties including an optimized insertion loss performance. Furthermore, the micro-rough surface 10 has a surface roughness Rz less than or equal 2.3 μm, which is measured in compliance with the JIS 94 and contributes to reducing the line width and line spacing.

Figure 2:
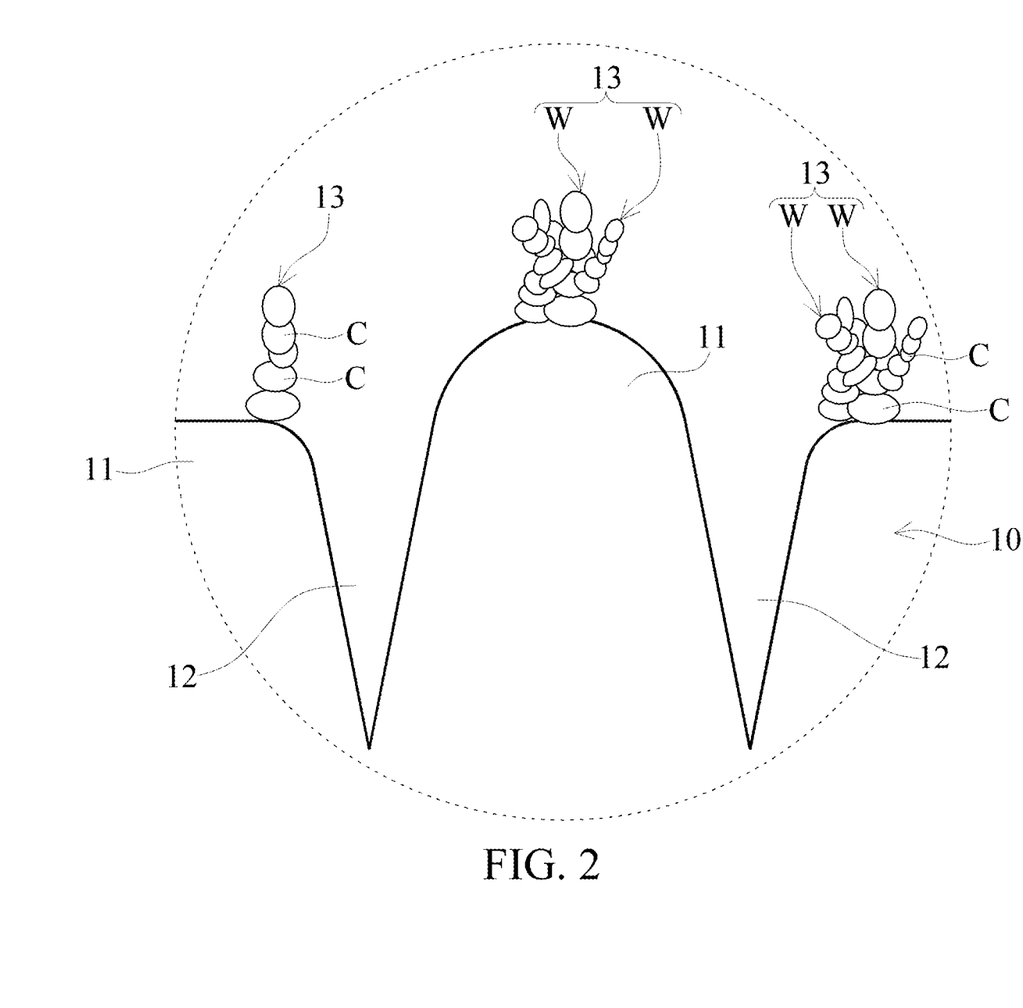
FIG. 2 is an enlarged view of part II of FIG. 1.

Reference is made to FIG. 2, in the micro-rough surface 10, each of the mountain-shaped structures 11 is formed with a micro-crystal cluster 13 on the top thereof. The micro-crystal cluster 13 can include at least one whisker W that is composed of a plurality of micro-crystals C stacked together. There is no limitation on the arrangement among the micro-crystal clusters 13. The micro-crystal clusters 13 can be arranged in a regular manner, i.e., they can be arranged along the same direction, but are not limited thereto. Each of the micro-crystal clusters 13 has an average height less than 2 μm, preferably less than 1.8 μm, and more preferably less than 1.6 μm. The aforesaid "average height" refers to a vertical distance from the top surface of the micro-crystal cluster 13 to the top surface of the corresponding mountain-shaped structure 11.

In the present disclosure, as shown in FIG. 2, any one of the micro-crystal clusters 13 can include a plurality of whiskers W that extend in different directions and form into a branch structure. Each of the whiskers W has a number of the micro-crystal C stacked in a height direction thereof that is less than 15, preferably less than 13, more preferably less than 10, and most preferably less than 8. Each of the micro-crystals C has an average diameter less than 0.5 μm, preferably between 0.05 μm and 0.5 μm, more preferably between 0.1 μm and 0.4 μm.

In addition, if the mountain-shaped structures 11 of the micro-rough surface 10 has a Wa value falling within the above ranges, each of the recessed structures 12 would have a U-shaped or V-shaped cross-section profile. Therefore, each of the recessed structures 12 can be filled with a greater amount of an adhesive to increase the bonding strength (i.e., peel strength) between the copper foil and the substrate while providing a good insertion loss performance. Each of the recessed structures 12 has an average depth less than 1.5 µm, preferably less than 1.3 µm, and more preferably less than 1 µm. Each of the recessed structures 12 has an average width between 0.5 µm and 4 µm, preferably between 0.6 µm and 3.8 µm.

In the present disclosure, the micro-roughened electrodeposited copper foil 1 can be obtained by performing an electrodeposition roughening treatment on a surface (e.g., shiny surface) of a raw foil. For example, a reverse treated foil (RTF), a high-temperature-elongation (HTE) copper foil, or a very low profile (VLP) copper foil is used as a raw foil, and subsequently an electrodeposition roughening treatment is performed on a surface of the raw foil by any well-known apparatus such as a continuous-type or batch-type electrodepositing apparatus. Preferably, the electrodepositing apparatus is a continuous-type electrodepositing apparatus that can include a plurality of electrolyzing tanks and a plurality of electrolyzing rolls respectively working with the electrolyzing tanks. The electrolyzing tanks can respectively accommodate copper-containing electrodeposition solutions of different compositions and a constant current can be applied to the electrolyzing tanks. The production speed of the electrodepositing apparatus is controlled to be 5-20 m/min and the production temperature of the electrodepositing apparatus is controlled to be 20-60° C.

More specifically, the electrodeposition roughening treatment can use a copper-containing electrodeposition solution which contains copper ions, at least one metal additive and at least one non-metal additive. The source of copper ions may be exemplified by copper sulfate and copper nitrate. The metal additive may be exemplified by cobalt, iron, zinc, their oxides and their salts. The non-metal additive may be exemplified by gelatin, organic nitride, hydroxyethyl cellulose (HEC), polyethylene glycol (PEG), sodium 3-mercaptopropane sulphonate (MPS), Bis-(sodium sulfopropyl)-disulfide (SPS), and thiourea-containing compounds.

In one embodiment, the electrodeposition roughening treatment can have only two stages that can use the same or different copper-containing electrodeposition solutions. For example, two different copper-containing electrodeposition solutions (i.e., first and second copper-containing electrodeposition solutions) can be used to treat the surface of the raw foil in order. The first copper-containing electrodeposition solution has a copper ion concentration between 10 g/l and 30 g/l, an acid concentration between 70 g/l and 100 g/l, and a metal additive concentration between 150 mg/l and 300 mg/l. The second copper-containing electrodeposition solution has a copper ion concentration between 70 g/l and 100 g/l, an acid concentration between 30 g/l and 60 g/l, and a metal additive concentration between 15 mg/l and 100 mg/l.

The electrodeposition roughening treatment can be performed with a constant current and a constant voltage. In the one embodiment, a constant current density between 25 A/dm$^2$ and 40 A/dm$^2$ is applied to the first stage of the electrodeposition roughening treatment, and a constant current density between 20 A/dm$^2$ and 30 A/dm$^2$ is applied to the second stage of the electrodeposition roughening treatment. Also, a constant current density between 30 A/dm$^2$ and 56 A/dm$^2$ is applied to the first stage of the electrodeposition roughening treatment, and a constant current density between 23 A/dm$^2$ and 26 A/dm$^2$ is applied to the second stage of the electrodeposition roughening treatment. It should be noted that, in the treatment process, the electrodeposition current can be applied with a pulse or saw wave. In addition, when different constant voltages are used for the electrodeposition roughening treatment, each of the constant voltages must cause a constant current density to fall within the above ranges of the corresponding stage.

In another one embodiment, the electrodeposition roughening treatment can have more than two stages that can alternately use the first and second copper-containing electrodeposition solutions at a constant current density between 1 A/dm$^2$ and 60 A/dm$^2$. For example, the electrodeposition roughening treatment has four stages, in which first and second stages use the same operating conditions as that of the one embodiment, a third stage uses the first copper-containing electrodeposition solution at a constant current density between 1 A/dm$^2$ and 8 A/dm$^2$, and a fourth stage uses the second copper-containing electrodeposition solution at a constant current density between 40 A/dm$^2$ and 60 A/dm$^2$. The electrodeposition roughening treatment can have more than five stages and, after the fifth stage, the constant current density can be controlled to be less than 5 A/dm$^2$. Similarly, in the treatment process, the electrodeposition current can be applied with a pulse or saw wave. In addition, when different constant voltages are used for the electrodeposition roughening treatment, each of the constant voltages must cause a constant current density to fall within the above range of the corresponding stage.

It should be noted that, the arrangements and extension directions of the micro-crystal clusters 13 and the recessed structures 12 of the micro-rough surface 10 can be controlled by a flow field of the copper-containing electrodeposition solution(s). More specifically, when no flow field or a turbulent flow is generated, the micro-crystal clusters 13 are arranged in an irregular manner. When the flow field is generated along a predetermined direction above the surface of the raw foil, at least one portion of the micro-crystal clusters 13 are arranged in a regular manner. That is to say, the micro-crystal clusters 13 are substantially arranged along the same direction. However, such details of the formation of the micro-crystal clusters 13 are merely examples, and the present disclosure is not limited thereto. In other embodiments, the micro-rough surface 10 can have micro-structures formed in a physical manner. For example, a steel brush can be used to scratch the surface of the raw foil.

Figure 3:
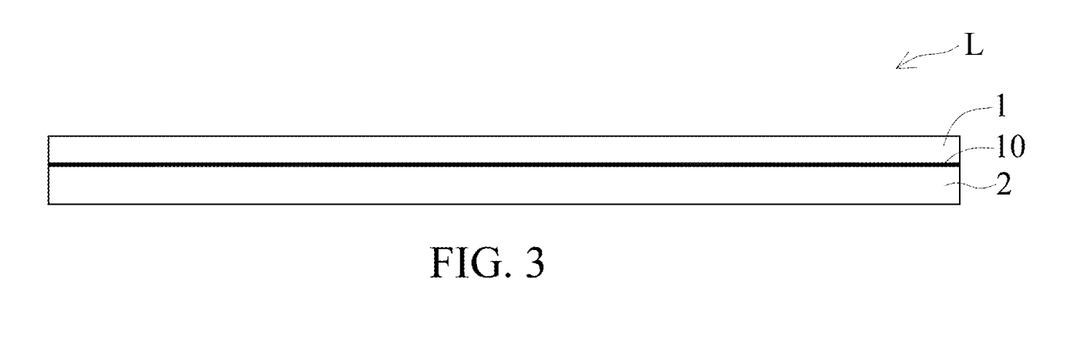
FIG. 3 is a schematic view of a copper clad laminate of the present disclosure.
Figure 4:
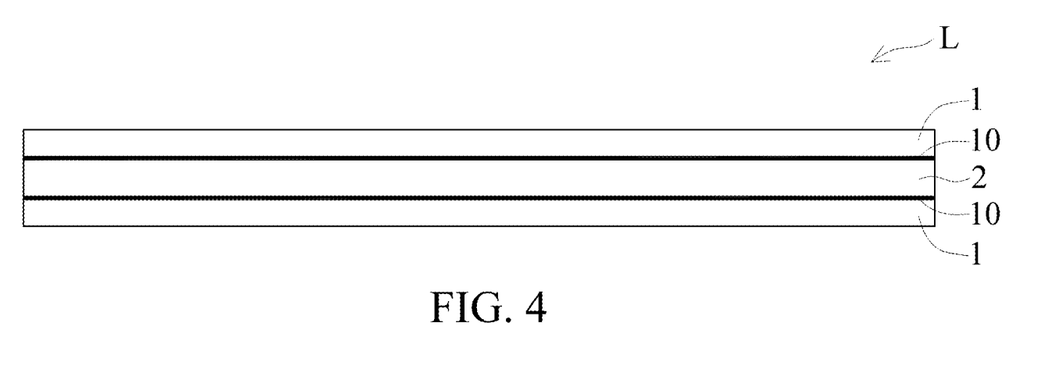
FIG. 4 is another schematic view of a copper clad laminate of the present disclosure.

Reference is made to FIG. 3 and FIG. 4, the present disclosure further provides a copper clad laminate L which includes a substrate 2 and at least one micro-roughened electrodeposited copper foil 1. In practice, as shown in FIG. 3, the number of the micro-roughened electrodeposited copper foil 1 can be only one, and is attached to a surface of the substrate 2. As shown in FIG. 4, the number of the micro-roughened electrodeposited copper foil 1 can be two, and are respectively attached to two opposite surfaces of the substrate 2. The micro-rough surface 10 of the micro-roughened electrodeposited copper foil 1 is in contact with the corresponding surface of the substrate 2.

The substrate 2 can be made of a mid-loss material or a low-loss material. The low-loss material is more helpful to highlighting the differences in electrical property of the copper foil than the mid-loss material. The term "mid-loss material" refers to a dielectric material having a dielectric constant (Dk) between 3.5 and 4.0 and a dissipation factor (DO greater than 0.010 and less than or equal to 0.015. The term "low-loss material" refers to a dielectric material having a dielectric constant (Dk) between 3.2 and 3.8 and a dissipation factor (DO greater than 0.005 and less than or equal to 0.010.

The substrate can be a prepreg that is a composite material made by impregnating a base material with a synthetic resin. The base material may, for example, be a phenolic cotton paper, cotton paper, resin fiber fabric, resin fiber non-woven fabric, glass board, glass woven fabric, or glass non-woven fabric. The synthetic resin may, for example, be an epoxy resin, polyester resin, polyimide resin, cyanate ester resin, bismaleimide triazine resin, polyphenylene ether resin, or phenol resin. The synthetic resin layer may be formed into a single layer or multi layers, but is not limited thereto. The substrate 2 may be made of, but not limited to, an EM891, IT958G, IT150DA, S7439G, MEGTRON 4, MEGTRON 6, or MEGTRON 7 material.

The following will describe the advantages of the present disclosure by showing Examples 1 to 3 together with Comparative Examples 1 to 4.

Example 1

Figure 5:
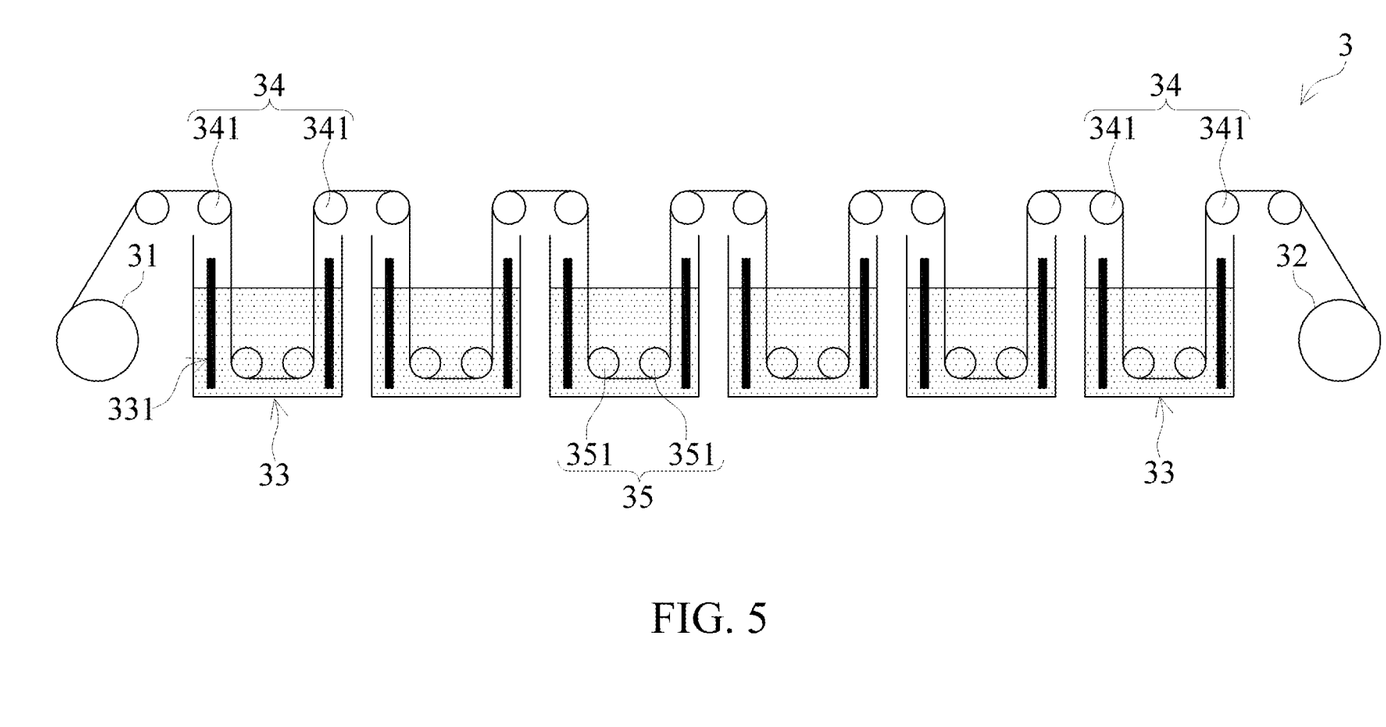
FIG. 5 is a schematic view showing an electrodepositing apparatus for manufacturing the micro-roughened electrodeposited copper foil of the present disclosure.

Reference is made to FIG. 4 along with FIG. 5, a continuous-type electrodepositing apparatus 3 is shown, which can be used to form a micro-rough surface 10 of a micro-roughened electrodeposited copper foil 1. The continuous-type electrodepositing apparatus 3 includes a feeding roll 31, a receiving roll 32, a plurality of electrolyzing tanks 33 (i.e., first to sixth electrolyzing tanks) arranged between the feeding roll 31 and the receiving roll 32, a plurality of electrolyzing roll assemblies 34 respectively arranged above the electrolyzing tanks 33, and a plurality of auxiliary roll assemblies 35 respectively arranged in the electrolyzing tanks 33. Each of the electrolyzing tanks 33 has a pair of electrodes 331 (e.g., platinum electrodes) arranged therein. Each of the electrolyzing roll assemblies 34 includes two electrolyzing rolls 341. Each of the auxiliary roll assemblies 35 includes two auxiliary rolls 351. The pair of platinum electrodes 231 in each of the electrolyzing tanks 33 and the corresponding electrolyzing roll assembly 34 are electrically connected to an outer power supply.

In this example, a reverse treated foil (RTF) (product name "RG311", purchased from Co-Tech Copper Foil Company) is used as a raw foil. The raw foil is rolled up on the feeding roll 31 and pulled firmly onto the electrolyzing roll assemblies 34 and the auxiliary roll assemblies 35 in order, and is subsequently rolled up on the receiving roll 32. The copper-containing electrodeposition solution in each of the electrolyzing tanks 33 is shown in Table 1. The raw foil sequentially passes through the first to sixth tanks 33 at a production speed of 10 m/min to be electrodeposited for roughening treatment. Accordingly, a micro-roughened electrodeposited copper foil 1 having a surface roughness Rz of 2.3 μm is obtained, and surface and cross-sectional structures thereof are respectively shown in FIG. 6 and FIG. 7, which are scanning electron microscope images imaged by a scanning electron microscope (Hitachi High-Technologies Corporation, S-3400N) and taken with a +35 degree tilt.

The arithmetic mean height (Sa) and the vertex density (Spd) of the micro-rough surface 10 of the micro-roughened electrodeposited copper foil 1 are obtained by using a laser microscope to directly measure the uneven profile of the micro-rough surface 10. A preferable method for obtaining the arithmetic mean height (Sa) and the vertex density (Spd) includes: attaching the micro-roughened electrodeposited copper foil 1 to a prepreg substrate, such that the uneven profile of the micro-rough surface 10 is transferred to a surface of the prepreg substrate; removing the micro-roughened electrodeposited copper foil 1 by selective etching; and measuring an uneven profile of the surface of the prepreg substrate.

The insertion loss of the micro-roughened electrodeposited copper foil 1 of Example 1 is measured by a stripline test method at 4 GHz, 8 GHz, 12.89 GHz and 16 GHz, and the result is shown in Table 2.

Two of the micro-roughened electrolysis copper foils 1 of Example 1 are adhered to a substrate 2 that is made of a low-loss prepreg (product name "S7439G"), in which each of the micro-rough surfaces 10 is coated with a silane coupling agent, so as to form a copper clad laminate L. After curing, the IPC-TM-650 4.6.8 test method is used for peel strength measurement, and the result is shown in Table 2.

Examples 2 and 3

The raw foil, the electrodepositing apparatus and the composition of the copper-containing electrodeposition solutions are the same as in Example 1. The electrodepositing conditions are shown in Table 1 and the production speed is 10 m/min. One of the micro-roughened electrolysis copper foils 1 of Examples 2 and 3 are used for measurements of Sa and Spd values. Two of the micro-roughened electrolysis copper foils 1 of Examples 2 and 3 are respectively adhered to a substrate 2 that is made of a low-loss prepreg (product name "S7439G"), so as to form two copper clad laminates L. The copper clad laminates L are measured in the same ways as in Example 1, and the results are shown in Table 2.

Comparative Examples 1 and 2

The raw foil, the electrodepositing apparatus and the composition of the copper-containing electrodeposition solutions are the same as in Example 1. The electrodepositing conditions are shown in Table 1 and the production speed is 10 m/min. One of the micro-roughened electrolysis copper foils 1 of Comparative Examples 1 and 2 are used for measurements of Sa and Spd values by the same methods as in Example 1, and the results are shown in Table 2. In addition, two of the micro-roughened electrolysis copper foils 1 of Comparative Examples 1 and 2 are respectively adhered to a substrate 2 that is made of a low-loss prepreg (product name "S7439G"), so as to form two copper clad laminates L. Another two of the micro-roughened electrolysis copper foils 1 of Comparative Examples 1 and 2 are respectively adhered to a substrate 2 that is made of a mid-loss prepreg (product name "S7040G"), so as to form another two copper clad laminates L. The copper clad laminates L are used for the peel strength measurement by the same method as in Example 1, and the results are shown in Table 2.

Comparative Example 3

Figure 8:
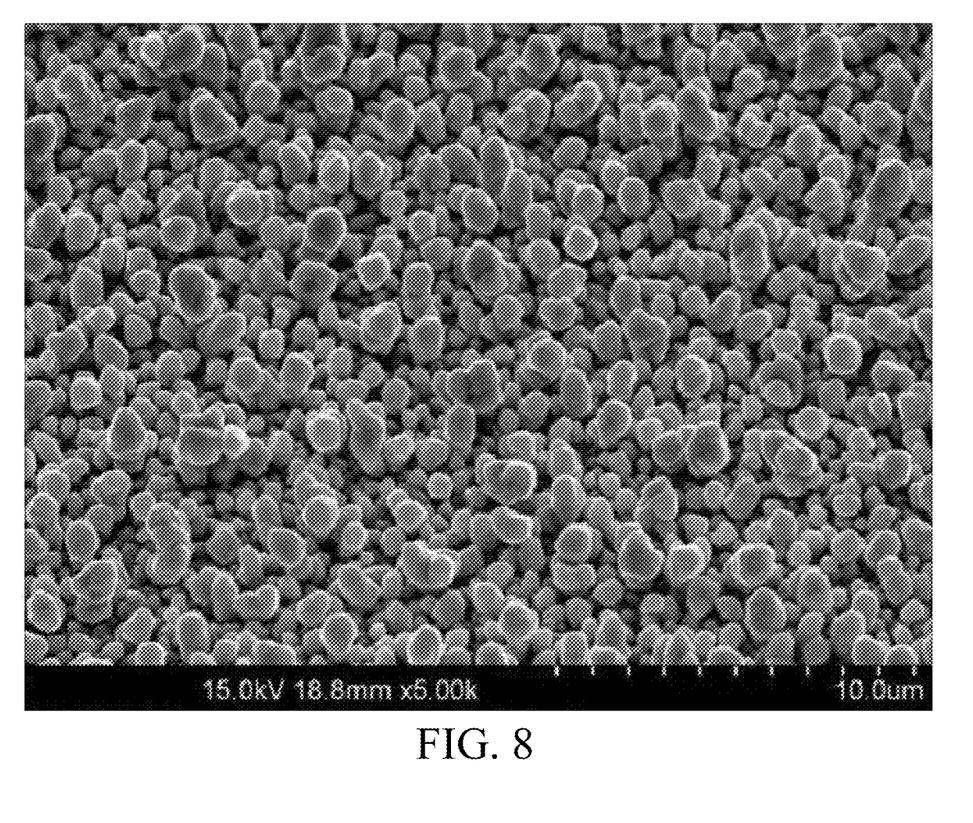
FIG. 8 is a scanning electron microscope image showing a surface profile of a copper foil of Comparative Example 3.
Figure 9:
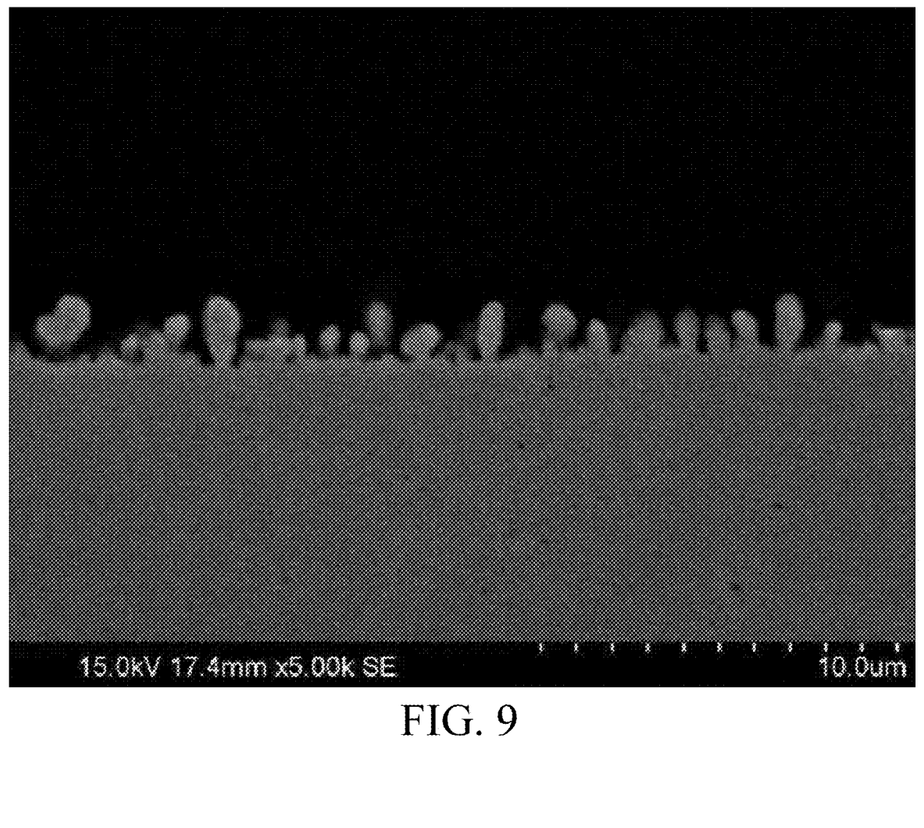
FIG. 9 is a scanning electron microscope image showing a cross-section profile of the copper foil of Comparative Example 3.

Comparative Example 3 uses reverse treated foils (product name "RTF3", hereinafter "RTF3 copper foil"). The surface and the cross-sectional structures of the RTF3 copper foil are shown in FIG. 8 and FIG. 9 respectively, which are scanning electron microscope images imaged by a scanning electron microscope (Hitachi High-Technologies Corporation, S-3400N) and taken with a +35 degree tilt. One of the RTF3 copper foils is used for measurements of Sa and Spd values by the same methods as in Example 1, and the results are shown in Table 3. In addition, two of the RTF3 copper foils are respectively adhered to a substrate 2 that is made of a low-loss prepreg (product name "S7439G"), so as to form two copper clad laminates L. Another two of the RTF3 copper foils are respectively adhered to a substrate 2 that is made of a mid-loss prepreg (product name "S7040G"), so as to form another two copper clad laminates L. The copper clad laminates L are used for the peel strength measurement by the same method as in Example 1, and the results are shown in Table 3.

Figure 6:
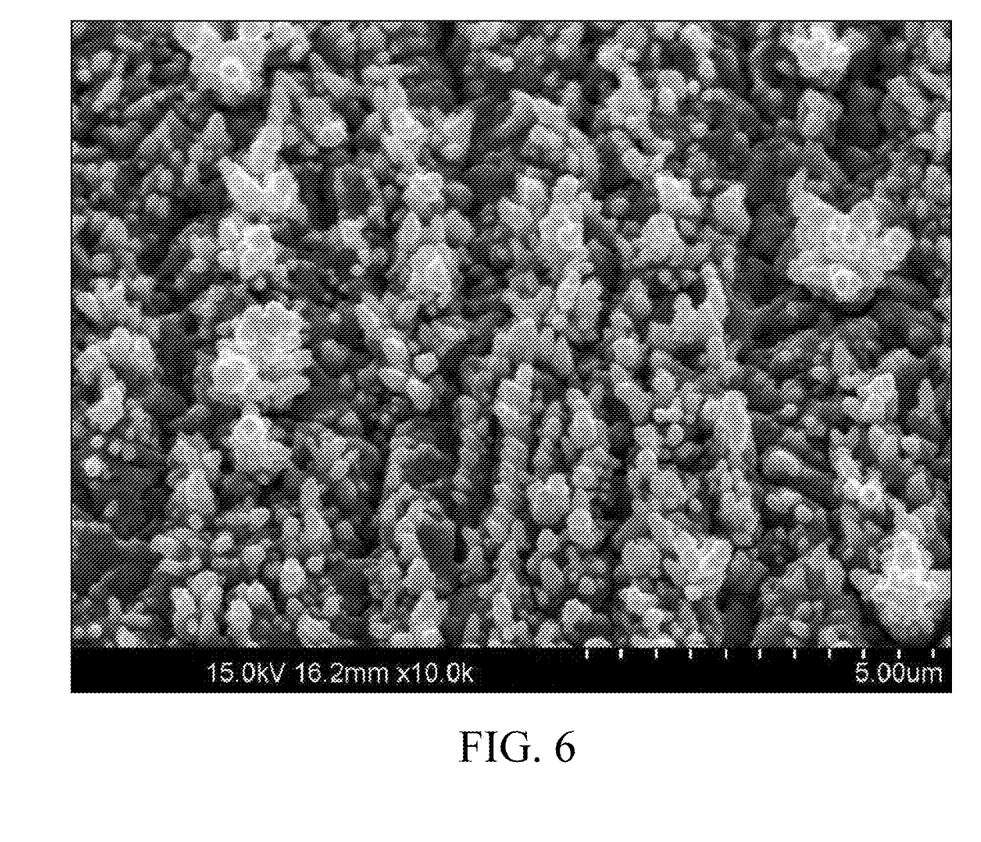
FIG. 6 is a scanning electron microscope image showing a surface profile of a micro-roughened electrodeposited copper foil of Example 1.
Figure 7:
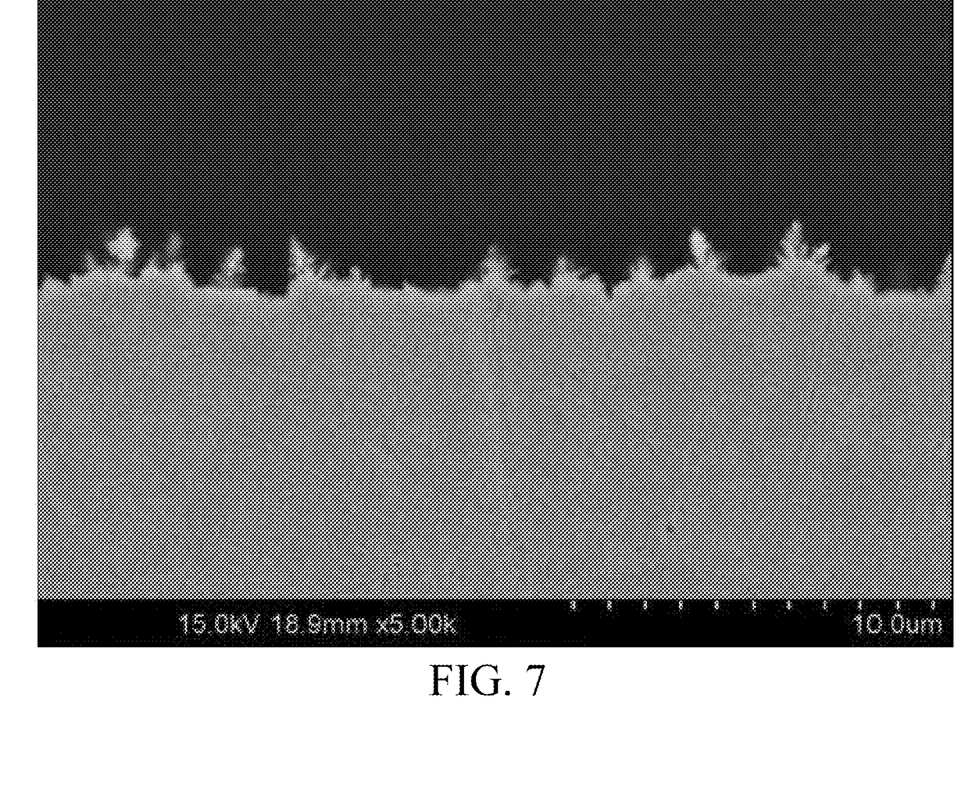
FIG. 7 is a scanning electron microscope image showing a cross-section profile of the micro-roughened electrodeposited copper foil of Example 1.

Referring to FIG. 6 and FIG. 7 in conjunction with FIG. 2, the micro-rough surface 10 of Example 1 has a plurality of recessed structures 12 such as grooves that substantially extend along the same direction. Each of the recessed structure 12 has a width between 0.1 μm and 4 μm and a depth less than or equal than 0.8 μm. The mountain-shaped structures 11 among the recessed structures 12 have clear micro-crystal clusters 13 correspondingly formed on the

TABLE 1

|  | Fist tank | Second tank | Third tank | Fourth tank | Fifth tank | Sixth tank |
|---|---|---|---|---|---|---|
| $Cu^{+2}$ (g/l) | 15.5-20.5 | 86.5-90.5 | 15.5-20.5 | 86.5-90.5 | 15.5-20.5 | 86.5-90.5 |
| Cl (ppm) | <3 | <3 | <3 | <3 | <3 | <3 |
| $H_2SO_4$ (g/l) | 83-87 | 45-55 | 83-87 | 45-55 | 83-87 | 45-55 |
| Metal additive (ppm) | 180-220 | 30-40 | 180-220 | 30-40 | 180-220 | 30-40 |
| Example 1 ($A/dm^2$) | 30.56 | 24.60 | 48.15 | 4.63 | 1.05 | 4.92 |
| Example 2 ($A/dm^2$) | 33.34 | 24.60 | 48.15 | 4.63 | 1.05 | 4.92 |
| Example 3 ($A/dm^2$) | 36.11 | 24.60 | 48.15 | 4.63 | 1.05 | 4.92 |
| Comparative Example 1 ($A/dm^2$) | 46.30 | 24.60 | 48.15 | 4.63 | 1.05 | 4.92 |
| Comparative Example 2 ($A/dm^2$) | 55.56 | 24.60 | 48.15 | 4.63 | 1.05 | 4.92 |

TABLE 2

| | | | Examples | | | Comparative Examples | |
|---|---|---|---|---|---|---|---|
| | | | 1 | 2 | 3 | 1 | 2 | 3 |
| Sa (μm) | | | 0.401 | 0.505 | 0.519 | 0.534 | 0.573 | 0.586 |
| Spd ($1/mm^2$) | | | 502,139 | 613,823 | 625,472 | 642,913 | 674,520 | 573,939 |
| Sa × Spd ($μm/mm^2$) | | | 201,358 | 309,981 | 324,620 | 343,316 | 386,500 | 336,328 |
| Wa (μm) | | | 0.14 | 0.102 | 0.103 | 0.094 | 0.083 | 0.057 |
| Insertion loss (low-loss PP, S7439G) (dB/in) | Peel strength (lb/in) | | 4.1 | 4.71 | 4.92 | 5.01 | 5.21 | 5.6 |
| | 4 | GHz | −0.198 | −0.199 | −0.199 | −0.223 | −0.241 | −0.200 |
| | 8 | GHz | −0.304 | −0.308 | −0.310 | −0.342 | −0.367 | −0.311 |
| | 12.89 | GHz | −0.408 | −0.423 | −0.429 | −0.458 | −0.493 | −0.430 |
| | 16 | GHz | −0.499 | −0.516 | −0.530 | −0.560 | −0.605 | −0.530 |
| Insertion loss (mid-loss PP, S7404G) (dB/in) | Peel strength (lb/in) | | 4.12 | 4.85 | 5.07 | 5.14 | 5.33 | 5.7 |
| | 4 | GHz | −0.443 | −0.445 | −0.447 | −0.466 | −0.468 | −0.514 |
| | 8 | GHz | −0.780 | −0.788 | −0.803 | −0.814 | −0.823 | −0.910 |
| | 12.89 | GHz | −1.177 | −1.203 | −1.217 | −1.220 | −1.265 | −1.376 |
| | 16 | GHz | −1.422 | −1.439 | −1.445 | −1.467 | −1.475 | −1.663 |

TABLE 3

Electrical property comparison based on the RTF3 copper foil

| | | | Examples | | | Comparative Examples | | |
|---|---|---|---|---|---|---|---|---|
| | | | 1 | 2 | 3 | 1 | 2 | 3 |
| Sa (μm) | | | 0.401 | 0.505 | 0.519 | 0.534 | 0.573 | 0.586 |
| Spd ($1/mm^2$) | | | 502,139 | 613,823 | 625,472 | 642,913 | 674,520 | 573,939 |
| Sa × Spd ($μm/mm^2$) | | | 201,358 | 309,981 | 324,620 | 343,316 | 386,500 | 336,328 |
| Wa (μm) | | | 0.14 | 0.102 | 0.103 | 0.094 | 0.083 | 0.057 |
| Insertion loss (low-loss PP, S7439G) (dB/in) | 4 | GHz | −15.14% | −14.81% | −14.49% | −9.21% | −8.63% | — |
| | 8 | GHz | −16.97% | −15.63% | −13.57% | −11.94% | −10.71% | — |
| | 12.89 | GHz | −18.87% | −15.73% | −14.47% | −14.10% | −10.04% | — |
| | 16 | GHz | −18.87% | −17.44% | −16.90% | −15.20% | −14.57% | — |
| Insertion loss (mid-loss PP, S7404G) (dB/in) | 4 | GHz | −16.03% | −15.51% | −14.99% | −10.31% | −9.71% | — |
| | 8 | GHz | −16.71% | −15.52% | −13.37% | −11.88% | −10.65% | — |
| | 12.89 | GHz | −16.94% | −14.41% | −13.09% | −12.77% | −8.76% | — |
| | 16 | GHz | −16.96% | −15.58% | −15.10% | −13.38% | −12.77% | — | tops thereof. Each of the micro-crystal clusters 13 has a height less than or equal to 2 µm and is composed of a plurality of micro-crystals C each having an average diameter less than about 0.5 µm stacked together.

Reference is made to FIG. 8 and FIG. 9. The surface of the RTF3 copper foil has a plurality of micro-crystals each having a particle diameter of about 1 µm uniformly distributed thereon. The micro-crystals do not aggregate at certain locations, i.e., only a few of the micro-crystals aggregate with each other.

As shown in Table 2 and Table 3, when the substrates 2 of the copper clad laminates L of Examples 1 to 3 each are formed by the low-loss prepreg (product name "S7439G"), they all have a peel strength of at least 4.10 lb/in that exceed the industry standard of 4 lb/in. When the substrates 2 of the copper clad laminates L of Examples 1 to 3 each are formed by the mid-loss prepreg (product name "S7040G"), they all have a peel strength of at least 4.12 lb/in that also exceed the industry standard of 4 lb/in. It is observed that the copper clad laminate L of the present disclosure has a bonding strength exceeding the industry standard, and is beneficial to performing the subsequent process and maintaining the quality of the electrical properties of end products.

As shown in Table 3, the copper clad laminates of Examples 1 to 3 and Comparative Examples 1 and 2, which have a substrate formed by a low-loss prepreg or a mid-loss prepreg, all have better insertion loss performance at 4 GHz to 16 GHz than the copper clad laminate of Comparative Example 3. It is worth mentioning that, when the uneven profile of the micro-rough surface is controlled to have a multiplication value of an arithmetic mean height (Sa) and a vertex density (Spd) and an arithmetic mean undulation (Wa) which fall within respective predetermined ranges, the transmission loss of high-frequency signals can be significantly reduced.

Furthermore, when said multiplication value (Sa×Spd) is less than 39000 µm/mm$^2$ and said arithmetic mean undulation (Wa) is greater than 0.08 µm, the copper clad laminate L using the low-loss prepreg (product name "S7439G") has good insertion loss performance. More specifically, the copper foil laminate L has an insertion loss between −0.350 and −0.371 dB/in at 4 GHz. The insertion loss is preferably between −0.352 and −0.369 dB/in at 4 GHz in consideration of peel strength. The copper foil laminate L has an insertion loss between −0.601 and −0.635 dB/in at 8 GHz. The insertion loss is preferably between −0.619 and −0.628 dB/in at 8 GHz in consideration of peel strength. The copper foil laminate L has an insertion loss between −0.885 and −0.956 dB/in dB/in at 12.89 GHz. The insertion loss is preferably between −0.919 and −0.922 dB/in at 12.89 GHz in consideration of peel strength. The copper foil laminate L has an insertion loss between −1.065 and −1.105 dB/in dB/in at 16 GHz. The insertion loss is preferably between −1.083 and −1.099 dB/in at 16 GHz in consideration of peel strength. It is observed that the micro-roughened electrodeposited copper foil 1 of the present disclosure can significantly reduce the signal transmission loss at 4 GHz to 16 GHz.

It is evident from the above description that the micro-roughened electrolysis copper foil can further improve the insertion loss performance to significantly reduce the signal losses while maintaining good peel strength. The micro-roughened electrolysis copper foil, which has a Wa value greater than 0.06 µm and less than and equal to 1.5 µm, can have the same signal integrity performance as the HVLP (Hyper Very Low Profile) copper foil.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A micro-roughened electrodeposited copper foil comprising a micro-rough surface that has a plurality of mountain-shaped structures and a plurality of recessed structures relative to the mountain-shaped structures, wherein a multiplication value of an arithmetic mean height (Sa) and a vertex density (Spd) of the mountain-shaped structures measured in compliance with ISO 25178 standard is from 150000 µm/mm$^2$ to 400000 µm/mm$^2$, and an arithmetic mean undulation (Wa) of the mountain-shaped structures measured in compliance with JIS B0601-2001 standard is greater than 0.06 µm and less than 1.5 µm, and wherein the micro-rough surface has a surface roughness Rz less than or equal to 2.3 µm measured in compliance with JIS 94 standard, and each of the recessed structures has an average width between 0.5 µm and 4 µm.

2. The micro-roughened electrodeposited copper foil according to claim 1, wherein the multiplication value (Sa×Spd) of the arithmetic mean height and the vertex density of the mountain-shaped structures is greater than 240,000 µm/mm$^2$ and less than or equal to 350,000 µm/mm$^2$.

3. The micro-roughened electrodeposited copper foil according to claim 1, wherein the arithmetic mean undulation (Wa) of the mountain-shaped structures is greater than 0.1 µm and less than or equal to 1.5 µm.

4. The micro-roughened electrodeposited copper foil according to claim 1, wherein each of the recessed structures has a U-shaped or V-shaped cross-section profile.

5. A copper clad laminate, comprising:
a substrate; and
a micro-roughened electrodeposited copper foil attached to a surface of the substrate and having a micro-rough surface that contacts the surface, wherein the micro-rough surface has a plurality of mountain-shaped structures and a plurality of recessed structures relative to the mountain-shaped structures, a multiplication value of an arithmetic mean height (Sa) and a vertex density (Spd) of the mountain-shaped structures measured in compliance with ISO 25178 standard is from 150000 µm/mm$^2$ to 400000 µm/mm$^2$, and an arithmetic mean undulation (Wa) of the mountain-shaped structures measured in compliance with JIS B0601-2001 standard is greater than 0.06 µm and less than 1.5 µm, and wherein the micro-rough surface has a surface roughness Rz less than or equal to 2.3 µm measured in compliance with JIS 94 standard, and each of the recessed structures has an average width between 0.5 µm and 4 µm.

6. The copper clad laminate according to claim 5, wherein the multiplication value (Sa×Spd) of the arithmetic mean height and the vertex density of the mountain-shaped structures is greater than 240,000 µm/mm$^2$ and less than or equal to 350,000 µm/mm$^2$.

7. The copper clad laminate according to claim 5, wherein the arithmetic mean undulation (Wa) of the mountain-shaped structures is greater than 0.1 μm and less than or equal to 1.5 μm.

8. The copper clad laminate according to claim 5, wherein each of the recessed structures has a U-shaped or V-shaped cross-section profile.

9. The copper clad laminate according to claim 5, wherein when the substrate is formed from a low-loss prepreg, the copper clad laminate has an insertion loss between −0.35 and −0.41 dB/in at 4 GHz, and when the substrate is formed from a mid-loss prepreg, the copper clad laminate has an insertion loss between −0.45 and −0.49 dB/in at 4 GHz.

10. The copper clad laminate according to claim 5, wherein when the substrate is formed from a low-loss prepreg, the copper clad laminate has an insertion loss between −0.61 and −0.69 dB/in at 8 GHz, and when the substrate is formed from a mid-loss prepreg, the copper clad laminate has an insertion loss between −0.76 and −0.86 dB/in at 8 GHz.

11. The copper clad laminate according to claim 5, wherein when the substrate is formed from a low-loss prepreg, the copper clad laminate has an insertion loss between −0.90 and −1.01 dB/in at 12.89 GHz, and when the substrate is formed from a mid-loss prepreg, the copper clad laminate has an insertion loss between −1.06 and −1.30 dB/in at 12.89 GHz.

12. The copper clad laminate according to claim 5, wherein when the substrate is formed from a low-loss prepreg, the copper clad laminate has an insertion loss between −1.03 and −1.20 dB/in at 16 GHz, and when the substrate is formed from a mid-loss prepreg, the copper clad laminate has an insertion loss between −1.4 and −1.45 dB/in at 16 GHz.

13. The copper clad laminate according to claim 5, wherein when the substrate is formed from a low-loss prepreg, the substrate has a dielectric constant (Dk) greater than or equal to 3.2 and less than or equal to 3.8 and a dissipation factor (Df) greater than 0.005 and less than or equal to 0.010 at 10 GHz, and when the substrate is formed from a mid-loss prepreg, the substrate has a dielectric constant (Dk) greater than or equal to 3.5 and less than or equal to 4.0 and a dissipation factor (Df) greater than 0.010 and less than or equal to 0.015 at 10 GHz.

* * * * *